(12) United States Patent
Matsumoto et al.

(10) Patent No.: US 8,475,618 B2
(45) Date of Patent: Jul. 2, 2013

(54) MANUFACTURING METHOD OF HERMETIC CONTAINER

(75) Inventors: Mamo Matsumoto, Kawasaki (JP); Tomohiro Saito, Koza-gun (JP); Nobuhiro Ito, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 13/198,867

(22) Filed: Aug. 5, 2011

(65) Prior Publication Data

US 2012/0055196 A1 Mar. 8, 2012

(30) Foreign Application Priority Data

Sep. 6, 2010 (JP) .................................. 2010-198912

(51) Int. Cl.
*B32B 37/16* (2006.01)

(52) U.S. Cl.
USPC ...................................................... 156/272.8

(58) Field of Classification Search
USPC .................... 156/272.2, 272.8, 109; 65/43
See application file for complete search history.

(56) References Cited

U.S. PATENT DOCUMENTS

| | | | |
|---|---|---|---|
| 5,426,631 A | 6/1995 | Miyazaki et al. | |
| 5,693,111 A | 12/1997 | Kadowaki et al. | |
| 5,722,031 A | 2/1998 | Fujii et al. | |
| 6,087,619 A | 7/2000 | Berkmanns et al. | |
| 6,109,994 A | 8/2000 | Cho et al. | |
| 6,113,450 A * | 9/2000 | Narayanan et al. | 445/25 |
| 6,517,399 B1 | 2/2003 | Ito et al. | |
| 6,722,937 B1 * | 4/2004 | Ludwig et al. | 445/25 |
| 6,817,917 B1 | 11/2004 | Kado et al. | |
| 6,926,571 B2 | 8/2005 | Ito et al. | |
| 7,039,303 B2 | 5/2006 | Kimura et al. | |
| 7,110,665 B2 | 9/2006 | Kamata et al. | |
| 7,362,038 B1 | 4/2008 | Jang et al. | |
| 7,383,875 B2 | 6/2008 | Yoshimura et al. | |
| 7,815,760 B2 | 10/2010 | Kimura et al. | |

(Continued)

FOREIGN PATENT DOCUMENTS

| | | |
|---|---|---|
| JP | 08-022767 A | 1/1996 |
| JP | 08-250021 A | 9/1996 |

(Continued)

OTHER PUBLICATIONS

Ito et al., U.S. Appl. No. 12/178,230, filed Jul. 23, 2008.

(Continued)

*Primary Examiner* — Daniel McNally
(74) *Attorney, Agent, or Firm* — Fitzpatrick, Cella, Harper & Scinto

(57) ABSTRACT

A manufacturing method of a hermetic container includes an assembling step of assembling the hermetic container and a sealing step of sealing by first and second sealing materials. Thus, in a case where local heating light is scanned toward an already-sealed portion of the second sealing material, since a separation portion of an unsealed state is located between the already-sealed portion and a downstream end of scanning, a load due to expansion/contraction of a frame body is applied to the first sealing material which is present in the separation portion of the unsealed state. After then, since the local heating light is irradiated to the first sealing material to which the load has been applied so as to heat and melt it, the load is relieved, whereby it is possible to suppress deterioration of joining strength and airtightness of the hermetic container.

5 Claims, 8 Drawing Sheets

U.S. PATENT DOCUMENTS

| | | | |
|---|---|---|---|
| 7,847,474 B2 | 12/2010 | Seon | |
| 7,914,357 B2 | 3/2011 | Koyanagi et al. | |
| 7,928,645 B2 | 4/2011 | Suzuki et al. | |
| 7,972,461 B2 | 7/2011 | Hasegawa et al. | |
| 8,038,498 B2 | 10/2011 | Miyauchi et al. | |
| 2005/0151151 A1 | 7/2005 | Hawtof et al. | |
| 2005/0199599 A1 | 9/2005 | Li et al. | |
| 2006/0082298 A1 | 4/2006 | Becken et al. | |
| 2006/0084348 A1 | 4/2006 | Becken et al. | |
| 2006/0244363 A1 | 11/2006 | Seon et al. | |
| 2006/0289870 A1 | 12/2006 | Hotta et al. | |
| 2007/0051499 A1 | 3/2007 | Kaimura et al. | |
| 2007/0200476 A1* | 8/2007 | Kijima et al. | 313/308 |
| 2008/0110561 A1 | 5/2008 | Lee et al. | |
| 2009/0000731 A1* | 1/2009 | Hasegawa et al. | 156/272.8 |
| 2009/0066215 A1 | 3/2009 | Kweon | |
| 2009/0120915 A1 | 5/2009 | Tagawa et al. | |
| 2009/0221207 A1 | 9/2009 | Russell et al. | |
| 2009/0229745 A1 | 9/2009 | Lee et al. | |
| 2010/0186350 A1 | 7/2010 | Nakazawa et al. | |
| 2010/0190408 A1 | 7/2010 | Kamiguchi et al. | |
| 2010/0190409 A1 | 7/2010 | Kamiguchi et al. | |
| 2011/0249376 A1 | 10/2011 | Wu | |

FOREIGN PATENT DOCUMENTS

| | | |
|---|---|---|
| JP | 09-208270 A | 8/1997 |
| JP | 2002-137939 A | 5/2002 |
| JP | 2002-515392 A | 5/2002 |
| JP | 2007-234334 A | 9/2007 |
| JP | 2008-059781 A | 3/2008 |
| JP | 2009-070687 A | 4/2009 |
| JP | 2009-104841 A | 5/2009 |
| JP | 2009-196859 A | 9/2009 |

OTHER PUBLICATIONS

Ito et al., U.S. Appl. No. 13/046,883, filed Mar. 14, 2011.
Ito et al., U.S. Appl. No. 13/070,527, filed Mar. 24, 2011.
Matsumoto et al., U.S. Appl. No. 13/079,104, filed Apr. 4, 2011.
Ishiwata et al., U.S. Appl. No. 13/151,342, filed Jun. 2, 2011.
Ito et al., U.S. Appl. No. 13/046,868, filed Mar. 14, 2011.
Mamo Matsumoto, U.S. Appl. No. 13/357,001, filed Jan. 24, 2012.
Matmo Matsumoto et al., U.S. Appl. No. 13/226,741, filed Sep. 7, 2011.

* cited by examiner

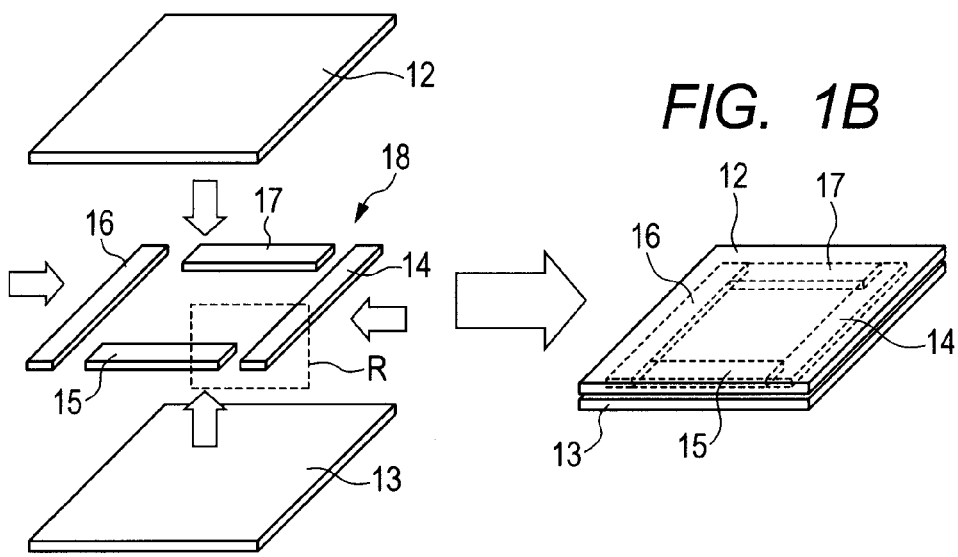
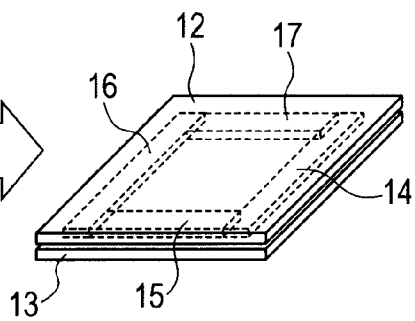
FIG. 1A
FIG. 1B
FIG. 1C
FIG. 1D

MANUFACTURING METHOD OF HERMETIC CONTAINER

BACKGROUND OF THE INVENTION

1. Field of the Invention

The present invention relates to a manufacturing method of a hermetic container. In particular, the present invention relates to a manufacturing method of a hermetic container, the inside of which has been vacuumized and which holds therein an electron-emitting device and a phosphor film.

2. Description of the Related Art

Conventionally, image displaying apparatuses of a flat panel type such as an organic LED (light-emitting diode) display (OLED), a field emission display (FED), a plasma display panel (PDP), and the like are well known. Each of these image displaying apparatuses is manufactured by hermetically sealing glass substrates facing each other, and has a container (hermetic container) in which the internal space is partitioned to an external space. To manufacture the hermetic container like this, a spacing distance defining member, a local adhesive and the like are arranged between the facing glass substrates as necessary, a sealing material is arranged in a frame shape to the peripheral portions of the glass substrates, and then a heat sealing process is performed. Here, as a sealing material heating method in the heat sealing process, a method whereby the whole glass substrates are baked by a furnace (whole heating), and a method whereby the substrate is locally heated along the sealing material (local heating) are known. Generally, the local heating is more advantageous than the whole heating from viewpoints of a time which is required to heat and cool, an energy which is required to heat, productivity, prevention of thermal deformation of the container, prevention of thermal deterioration of a function device arranged in the container, and the like. In particular, a laser beam is known as a means for the local heating.

Japanese Patent Application Laid-Open (Translation of PCT International Publication) No. 2002-515392 discloses a manufacturing method of a container of a flat panel display, which includes a method of forming a glass frit bar serving as a sealing material. The glass frit bar has a concavo-convex shape so as to improve airtightness at the outer peripheral portion of the flat panel display. In this method, the peripheral portion and the glass frit bar are fitted together and heated to melt the glass frit bar, whereby the flat panel display which is inexpensive and highly reliable for a long time can be manufactured.

Japanese Patent Application Laid-Open No. 2007-234334 discloses a manufacturing method of a container of an image displaying apparatus. In the manufacturing method disclosed in Japanese Patent Application Laid-Open No. 2007-234334, respective fitting portions (sealing portions) of plural frame members are sealed by using high melting point frit, whereby a joined frame body is constituted. Then, the frame body is set between a rear substrate and a front substrate, and the rear substrate, the front substrate and the frame body are sealed by low melting point frit.

Japanese Patent Application Laid-Open No. H09-208270 discloses a manufacturing method of double-glazed glass. In this method, a pair of glass plates and a frame body disposed between the glass plates are adhered by induction heating using high-frequency wave or microwave in which a difference between a dielectric loss of an adhesive and a dielectric loss of the glass plate and/or the frame body is used.

As described above, the method of manufacturing the hermetic container by joining the plural frame members like a frame to constitute the frame body and then sealing the frame body to the pair of the substrates is known. However, in case of generating, by using local heating light as a heating means, an amount of heat necessary to melt and soften the sealing material to obtain a sufficient joining strength, there is a case where a distortion occurs in the hermetic container. By this distortion, there are fears that the strength and the airtightness of the hermetic container decrease and the misalignment between the pair of the substrates occurs. This is because a temperature difference occurs between the pair of the substrates and the frame body due to the local heating light, and a difference occurs between the expansion/contraction amounts of the pair of the substrates and the frame body due to the temperature difference. In particular, when the local heating light is scanned along the frame body, the expansion/contraction amount of the frame body accumulates at the irradiation end portion of the local heating light. When the portion of the already-sealed frame body is present at the irradiation end portion of the local heating light, a distortion occurs between the irradiation end portion and the already-sealed portion, and this distortion becomes a factor for deteriorating the joining strength and the airtightness of the hermetic container.

The present invention aims to provide a hermetic container manufacturing method by which the joining strength and the airtightness of the hermetic container can be improved.

SUMMARY OF THE INVENTION

In a manufacturing method of a hermetic container according to the present invention, a first substrate and a frame body constituting a part of the hermetic container are sealed. More specifically, the manufacturing method comprises: an assembling step which includes a first step of arranging the frame body so as to have at least one separation portion having mutually facing two surfaces being separated from each other and of arranging a first sealing material between the facing two surfaces, and a second step of assembling the first substrate and the frame body so that a second sealing material having a frame shape along the frame body is arranged between the first substrate and the frame body; and a sealing step which includes sealing the frame body to the first substrate by scanning local heating light along the second sealing material and heating and melting the second sealing material, and sealing the separation portion of the frame body by irradiating the local heating light to the first sealing material provided in the separation portion. Further, in the sealing step, order of the scanning of the local heating light is determined so that, when the local heating light is scanned along an unsealed portion of the second sealing material toward an already-sealed portion of the second sealing material, the separation portion of an unsealed state is set between a downstream end of the scanning and the already-sealed portion, and, after the local heating light is scanned up to the downstream end, the local heating light is irradiated to the separation portion of the unsealed state between the already-sealed portion and the downstream end.

According to the present invention, in the case where the local heating light is scanned toward the already-sealed portion of the second sealing material, since the separation portion of the unsealed state is located between the already-sealed portion and the downstream end of the scanning, a load (compression distortion) due to expansion/contraction of the frame body is applied to the first sealing material which is present in the separation portion of the unsealed state. However, after then, since the local heating light is irradiated to the first sealing material to which the load has been applied so as to heat and melt the first sealing material, the load is relieved.

As a result, it is possible to suppress deterioration of joining strength and airtightness of the hermetic container.

By the airtight container manufacturing method according to the present invention, it is possible to improve the joining strength and the airtightness of the hermetic container.

Further features of the present invention will become apparent from the following description of exemplary embodiments with reference to the attached drawings.

BRIEF DESCRIPTION OF THE DRAWINGS

FIGS. 1A, 1B, 1C and 1D are perspective views indicating an assembly process in the present invention.

DESCRIPTION OF THE EMBODIMENTS

Preferred embodiments of the present invention will now be described in detail in accordance with the accompanying drawings.

A manufacturing method of a hermetic container of the present invention can be applied to a manufacturing method of a container of an FED, an OLED, a PDP or the like having a device, which is required to be hermetically sealed from an external atmosphere, in its internal space. Especially, in an image displaying apparatus such as the FED or the like having a container (hermetic container) of which the inside is kept to be a pressure reduced space, a load of atmospheric pressure is applied to the hermetic container due to the negative pressure, and a crack sometimes appears in a hermetic sealed portion by the load of atmospheric pressure. Such the crack sometimes impairs the long-term reliability in airtightness of the hermetic container. Since the present invention can improve the long-term reliability in airtightness of the hermetic container, the present invention can be preferably utilized in the above-described hermetic container of which the inside pressure is reduced. However, the manufacturing method of the hermetic container of the present invention is not limited to manufacturing of the hermetic container of which the inside is kept to be a pressure reduced space. The present invention can be widely applied to manufacture of a hermetic container having sealed portions on peripheral portions of the facing substrates or the manufacture of a sealed member in which substrates are sealed to each other.

Figure 9:
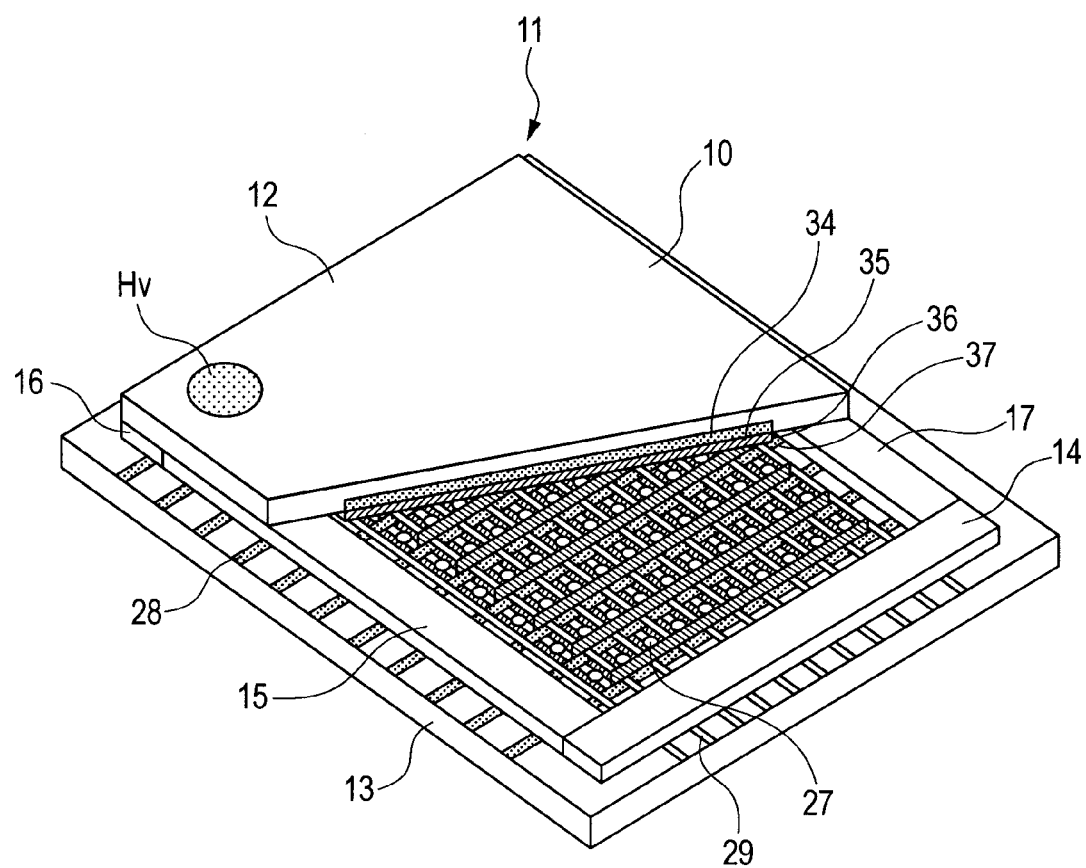
FIG. 9 is a partially broken perspective view of an FED, to which a manufacturing method of a hermetic container according to the present invention can be applied.

FIG. 9 is a partially broken perspective view indicating an image displaying apparatus targeted to the present invention. Here, it will be described by exemplifying the FED. A container (hermetic container) 10 of an image displaying apparatus 11 has a face plate (first substrate) 12, a rear plate (second substrate) 13 and plural frame members 14, 15, 16 and 17. It is preferable that these members which constitute the container are made from the glass. The plural frame members 14, 15, 16 and 17 are arranged in a frame shape, and the adjacent frame members are sealed to each other by a first sealing material 3 to constitute a frame body. The frame members to 17 are respectively located between the plate-like face plate 12 and the plate-like rear plate 13, whereby a closed space is formed between the face plate 12 and the rear plate 13. Concretely, the face plate 12 and the frame members 14 to 17 are sealed to each other with the mutually facing surfaces of them by a second sealing material 1, and the rear plate 13 and the frame members 14 to 17 are sealed to each other with the mutually facing surfaces of them by a third sealing material 2. As mentioned above, the plural frame members 14 to 17 are sealed to each other with sealed portions, which are sealing surfaces perpendicular to the face plate 12 (rear plate 13), and the container 10 having a closed internal space is formed. The internal space of the container 10 is maintained to be a vacuum state, and it is preferable that spacers (not illustrated) serving as spacing distance defining members between the face plate 12 and the rear plate 13 are provided with a predetermined pitch.

A large number of electron-emitting devices 27 for emitting electrons in accordance with an image signal are provided on the rear plate 13, where driving matrix wirings (X-directional wirings 28 and Y-directional wirings 29) used for operating the respective electron-emitting devices in accordance with the image signal are formed. Non-evaporable getters composed of Ti thin films (not illustrated) are formed on the driving matrix wirings. A Fluorescent film 34 having the phosphors for displaying an image by emitting the light upon receiving the irradiation of electrons emitted from the electron-emitting devices 27 is provided on the face plate 12, which is positioned to face the rear plate 13. Black stripes 35 are further provided on the face plate 12. The fluorescent film 34 and the black stripes 35 are provided in such a state of being alternately arranged. A metal back 36 composed of, for example, an Al thin film is formed on the fluorescent film 34. The metal back 36, which has a function of serving as an electrode for attracting electrons, receives the potential supply from a high voltage terminal Hv provided at the container 10. A non-evaporable getter 37 composed of a Ti thin film is formed on the metal back 36.

It is sufficient that the face plate 12, the rear plate 13 and the frame members 14 to 17 are transparent to have translucency, and a soda lime glass, a high strain point glass, a non-alkaline glass or the like can be used for them. It is desirable that these members 12, 13 and 14 to 17 have excellent wavelength permeability in a wavelength region of the local heating light and an absorption wavelength region of the sealing materials 1 to 3 to be described later.

Next, the manufacturing method of the hermetic container in the embodiment of the present invention will be described with reference to the attached drawings.

(Step 1) Preparation Stage

First, as illustrated in FIGS. 1A to 1D, the frame members 14 to 17 are prepared then the sealing materials 1 to 3 are formed on the frame members 14 to 17. In FIG. 1A, the four frame members 14 to 17 are arranged in a rectangle frame shape, and a frame body 18 is constituted. That is, the frame body 18 is constituted in such a frame shape of having four separation portions (mutually facing portions of adjacent frame members) which are mutually separated. By the way, since the separation portions are sealed in a later Step, these portions are also called sealed portions. Besides the above-described case, variations of the frame members 14 to 17 can be widely applied as illustrated in FIGS. 3A to 3D, if it is such a shape capable of forming a closed space as a hermetic container. In FIGS. 1A and 1B and FIGS. 3A to 3D, the frame body 18 is constituted from the four frame members 14 to 17, however the number of frame members may be any number. The frame body 18 may be constituted in such a frame shape of having separation portions separated by at least one portion. For example, a frame body having only one separation portion is such a frame body which is separated by cutting the frame shape by one portion and formed from one frame member.

As described later, the face plate 12 is sealed to the frame members 14 to 17 by the second sealing material 1. The rear plate 13 is sealed to the frame members 14 to 17 by the third sealing material 2. The frame members 14 to 17 are sealed to each other, that is, the separation portions of the frame body 18 are sealed by the first sealing material 3. The sealing materials 1 to 3 may be made from the same material or the different materials. The sealing materials 1 to 3 are such the materials softened at a high temperature, and it is preferable to have the temperature coefficients of negative viscosity. In addition, it is desirable that the temperature of a softening point of the boding materials 1 to 3 is lower than that of the face plate 12, the rear plate 13 and the frame members 14 to 17. As examples of the sealing materials 1 to 3, a glass frit, an inorganic adhesive and an organic adhesive can be enumerated. It is preferable that the sealing materials 1 to 3 exhibit the high absorbability for a wavelength of local heating light 41 to be described later. Also, there is sometimes a case that it is advantageous to vary the transmittance for the local heating light or change the thermophysical property such as a softening point depending on an assembly process to be described later. In case of applying the sealing material to a hermetic container, in which it is required to maintain the degree of vacuum in an internal space, a glass frit or an inorganic adhesive, which can suppress decomposition of a residual hydrocarbon, is preferably used as the sealing materials 1 to 3.

(Step 2) Assembly Process

Figure 4A:
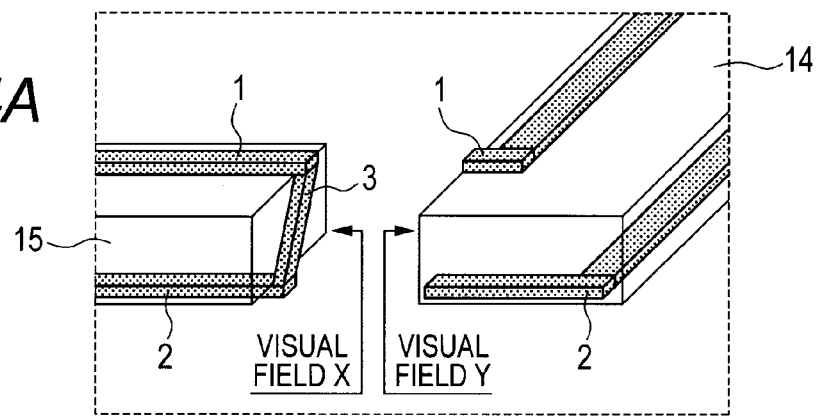
FIGS. 4A, 4B, 4C and 4D are views indicating forms of sealing materials in a sealed portion of the frame body.
Figure 4B:
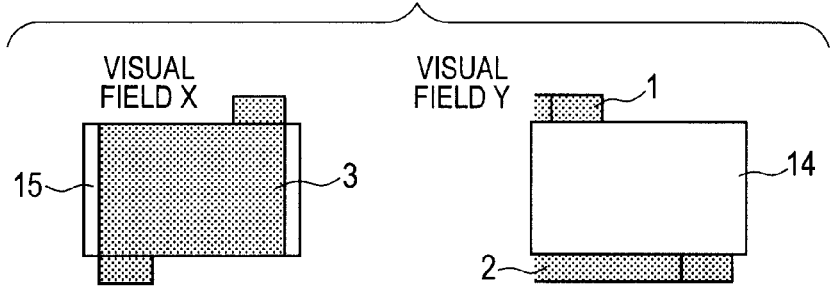
Figure 4C:
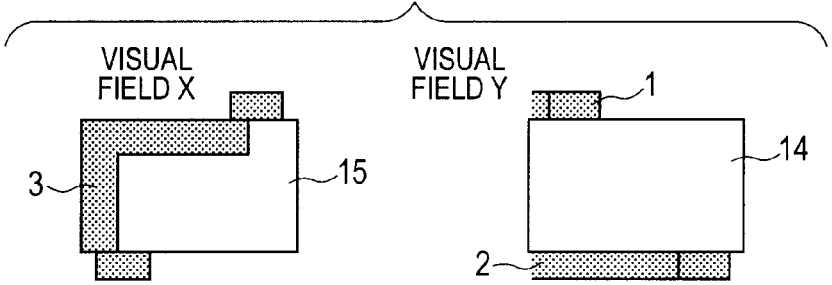
Figure 4D:
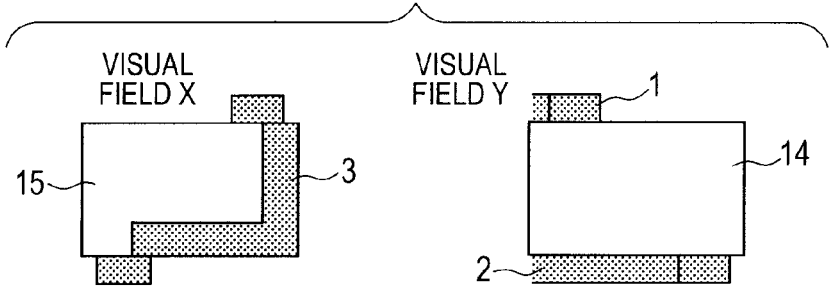

Next, as illustrated in FIGS. 1B, 1C and 1D, the frame members 14 to 17, on which the sealing materials 1 to 3 are formed, are arranged in a frame shape with such a state, where mutual sealing surfaces of the frame members face each other across the first sealing material 3, in the Step 1. Note that FIG. 1C is such a view, where a region R indicated in FIG. 1A is enlarged. A left side view in FIG. 1D is a plan view observed from the direction of a visual field X indicated in FIG. 1C, and a right side view in FIG. 1D is a plan view observed from the direction of a visual field Y indicated in FIG. 1C. Subsequently, the pressure is applied to the sealing materials 1 and 2 formed on the frame members 14 to 17 to be arranged so as to contact with the face plate 12 and the rear plate 13 as indicated in FIGS. 1A and 1B. At this time, the second sealing material 1 becomes to be arranged in a frame shape along the frame body 18 between the face plate 12 and the frame body 18. While, the third sealing material 2 becomes to be arranged in a frame shape along the frame body 18 between the rear plate 13 and the frame body 18. Hereinafter, the structure arranged in this manner is sometimes called a temporary assembled structure. A shape of the first sealing material 3 provided at a sealed portion (separation portion) between the frame member 14 and the frame member 15 is not limited to such a shape as indicated in FIGS. 1C and 1D. The first sealing material 3 may be arranged in any form including various shapes indicated in FIGS. 4B to 4D if a hermetic container can be constituted. Left side views in FIGS. 4B to 4D correspond to plan views observed from the direction of a visual field X indicated in FIG. 4A, and right side views in FIGS. 4B to 4D correspond to plan views observed from the direction of a visual field Y indicated in FIG. 4A. However, in a sealing process to be described later, since a sealing process is performed so that an internal space becomes hermetic, it is preferable that the first sealing material 3 serves as a bridge to connect the second sealing material 1 to the third sealing material 2. In addition, although the second sealing material 1 and the third sealing material 2 are formed on the frame body 18 in FIGS. 1C and 1D, these sealing materials 1 and 2 may be formed at the face plate 12 and the rear plate 13.

As indicated in FIG. 1C and FIG. 1D, it is preferable that the second sealing material 1 is arranged on a position closer to an internal side of the hermetic container and the third sealing material 2 is arranged on a position closer to an external side of the hermetic container. This arrangement is formed in order to secure a light path so that the incident light of the local heating light 41, which is described later, applied to the third sealing material 2 is not shielded by the second sealing material 1. However, the second sealing material 1 is not always arranged on the position closer to an internal side of the hermetic container but may be arranged on the position closer to an external side of the hermetic container. In this case, it is preferable that the third sealing material 2 is arranged on the position closer to an internal side of the hermetic container. Without limiting to these examples, it is preferable that the third sealing material 2 is arranged so as to produce a portion, which is not overlapped with the second sealing material 1 observed from an irradiation source of the local heating light 41, observed from the irradiation direction of the local heating light 41 in a sealing process to be described later. However, if the material having a large transmittance of the local heating light 41 is selected as the second sealing material 1, even if the second sealing material 1 and the third sealing material 2 are arranged in a state that they are overlapped with each other observed from the irradiation direction of the local heating light 41, both of them can be heated and melted.

(Step 3) Sealing Process

In a sealing process, the local heating light 41 is irradiated to the second sealing material 1 and the third sealing material 2 by moving the local heating light 41, and the face plate 12 is sealed to the frame members 14 to 17, and the rear plate 13 is sealed to the frame members 14 to 17. Additionally, the local heating light 41 is also irradiated to the first sealing material 3 arranged at a separation portion of the frame body 18 with a predetermined timing, and the separation portion is sealed.

It is sufficient that the local heating light 41 can locally heat the vicinity of a sealing region, and a semiconductor laser is preferably used as a light source. From a viewpoint of performance of locally heating the sealing materials 1 to 3 or the permeability of both the glass plates 12 and 13 or the frame body 18, a semiconductor laser for the processing which emits the light, of which a wavelength is in an infrared region, is preferable. When referring to FIG. 2A, a laser head 61, which emits the local heating light 41, is fixed to a breadboard 60, and the local heating light 41 is scanned by moving an object (a temporary assembled structure) including the sealing materials 1 to 3 to be irradiated. On the other hand, it may be that the object to be irradiated is fixed and the breadboard 60 for emitting the local heating light 41 is scanned along the sealing materials 1 to 3.

Figure 2A:
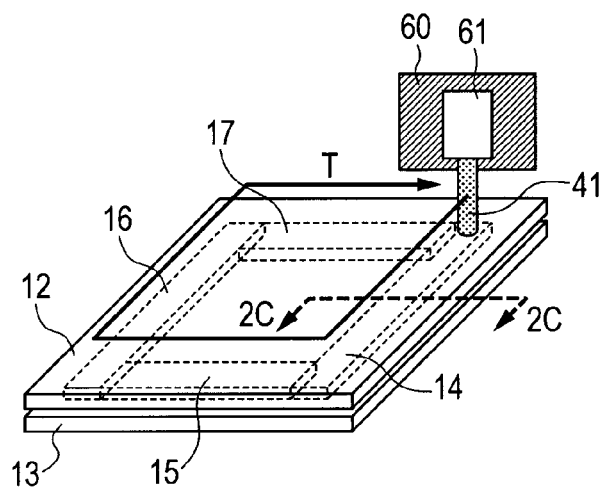
FIGS. 2A, 2B, 2C and 2D are views indicating an example of a local heating light irradiating method.

In one aspect of the present invention, as indicated in FIG. 2A, the local heating light 41 is first irradiated to the second sealing material 1 and the third sealing material 2 in the temporary assembled structure obtained in the Step 2. As for the irradiation of the local heating light 41, both of the sealing materials 1 and 2 may be heated and melted at the same time by one line of the local heating light 41 as indicated in FIGS.

Figure 2B:
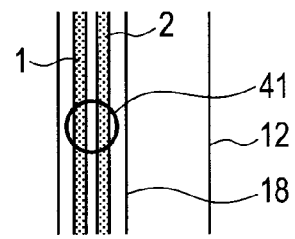
Figure 2C:
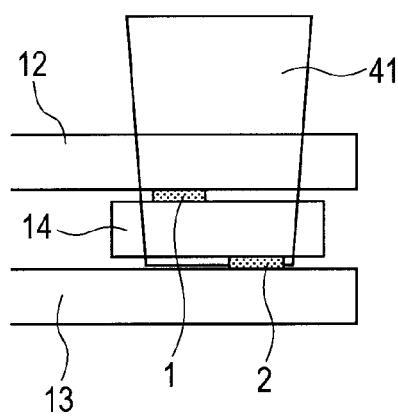
Figure 2D:
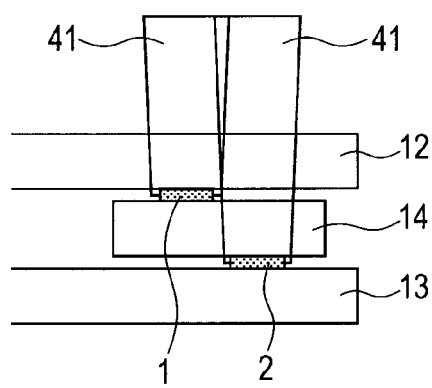
Figure 3A:
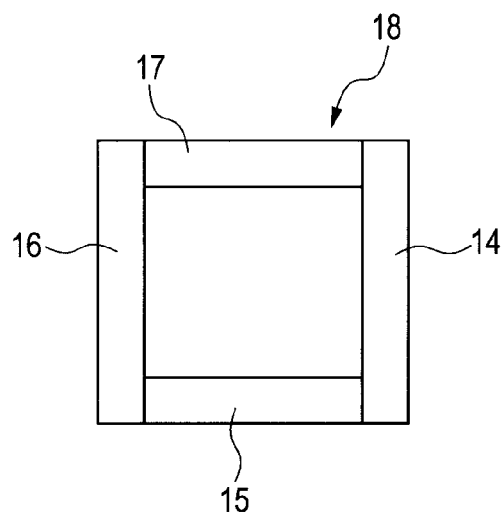
FIGS. 3A, 3B, 3C and 3D are views indicating variations of plural frame members which constitute a frame body.
Figure 3B:
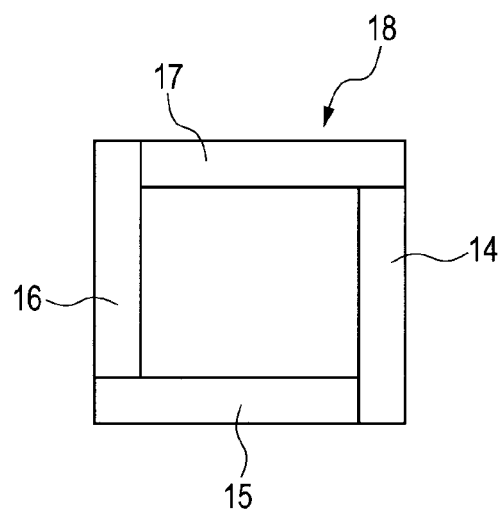
Figure 3C:
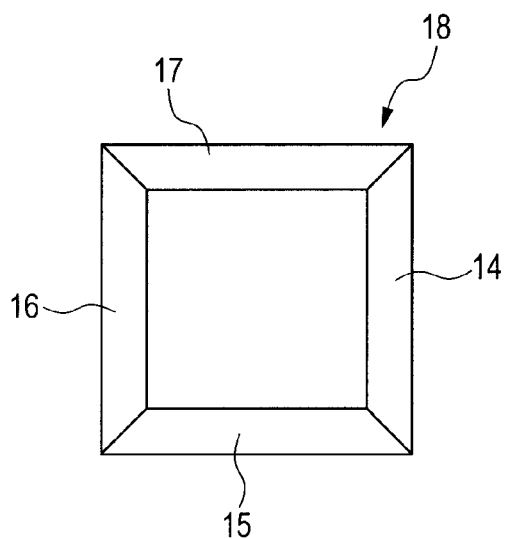
Figure 3D:
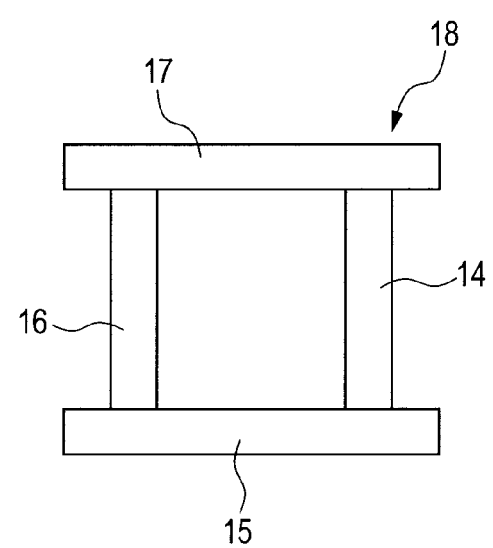

2B and 2C. Incidentally, FIG. 2B is a schematic diagram observing a portion of the frame body 18 of the temporary assembled structure from the direction orthogonal to the plates 12 and 13, and FIG. 2C is a cross-sectional view along the 2C-2C line in FIG. 2A. By heating and melting both of the sealing materials 1 and 2 at the same time, the face plate 12 and the rear plate 13 can be sealed to the frame body 18 at the same time. In addition, as indicated in FIG. 2D, the sealing between the rear plate 13 and the frame body 18 and the sealing between the face plate 12 and the frame body 18 can be also individually performed by irradiating the individual local heating light 41 to the second sealing material 1 and the third sealing material 2 respectively.

Figure 5A:
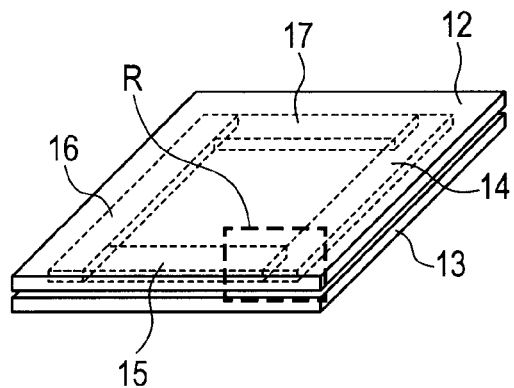
FIGS. 5A, 5B and 5C are views indicating an example of a local heating light irradiating method in the sealed portion of the frame body.
Figure 5B:
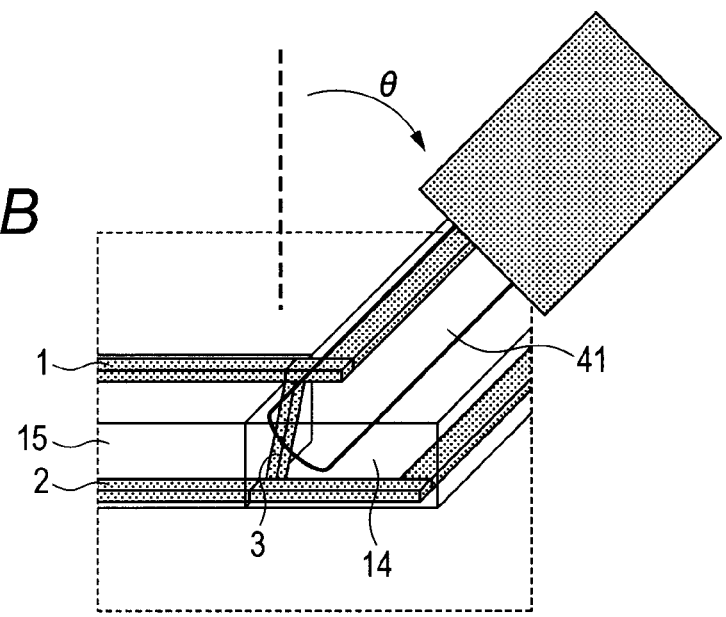
Figure 5C:
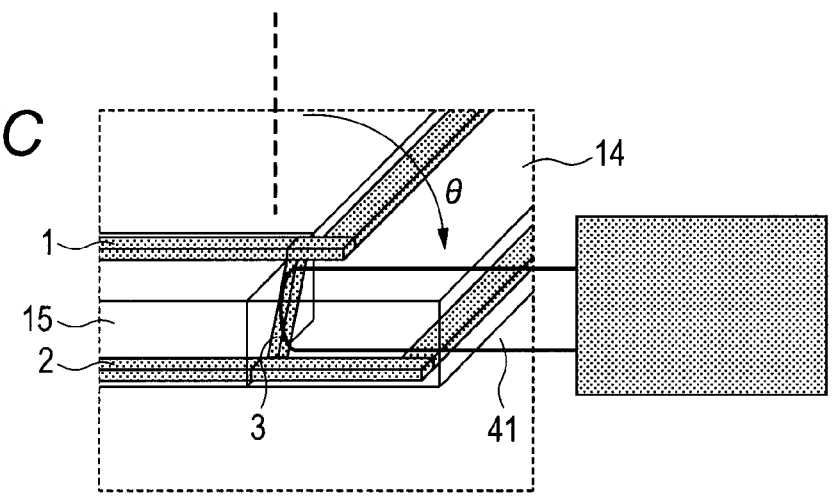

After irradiating the local heating light 41 to the second sealing material 1 and the third sealing material 2 along all the frame members 14 to 17, the first sealing material 3 is heated and melted by irradiating the local heating light 41 in spots to the separation portions between the frame members 14 to 17, and the separation portions of the frame body 18 are sealed. A spot irradiation of the local heating light 41 to the first sealing material 3 can be performed as indicated in FIGS. 5A to 5C. FIGS. 5B and 5C are enlarged views of the vicinity of a sealed portion of the frame body 18 indicated in FIG. 5A, and it is preferable that the first sealing material 3 is heated and melted by performing the spot irradiation with a state of inclining the local heating light 41 to the normal line direction of a sealing surface as illustrated in FIGS. 5B and 5C. More preferably, when an angle θ of inclination to the normal line direction of a sealing surface is set to 45° to 90°, it is desirable from a viewpoint that the first sealing material 3 can be uniformly heated. However, the local heating light 41 is not always required to be inclined depending on a fact of selecting the material having a larger heat conduction coefficient for the first sealing material 3 or adjusting the irradiating condition such as an output or an irradiation time of the local heating light 41 or an effective beam diameter.

Figure 7:
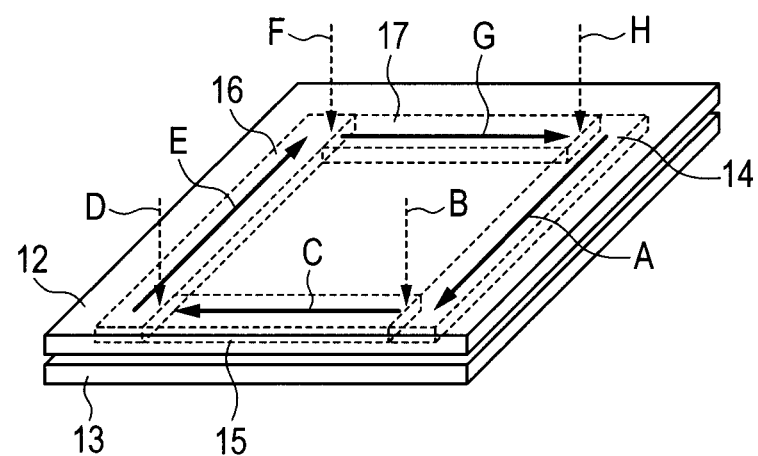
FIG. 7 is a view for describing an example of irradiation order of the local heating light.

In the above-described embodiment, the sealing materials 1 and 2 are heated and melted by first irradiating the local heating light 41 along the strip-shaped frame members 14 to 17 arranged on the four sides of the container 10, and the face plate 12 and the rear plate are respectively sealed to the frame body 18. Thereafter, the local heating light 41 is irradiated to the first sealing material 3 provided at the respective separation portions of the frame body 18. However, the irradiation order of the local heating light 41 is not limited to this case. A method of irradiating the local heating light 41 to the sealing material 3 in the course of scanning the local heating light 41 along the sealing materials 1 and 2 on the frame body 18 is also possible. As a concrete example, as indicated in FIG. 7, the local heating light 41 is irradiated to the sealing materials 1 and 2 by scanning the local heating light 41 from one end to other end along the frame member (first frame member) 14, and the frame member 14 is sealed to the face plate 12 and the rear plate 13 (refer to a symbol A in FIG. 7). Thereafter, the local heating light 41 is irradiated to the first sealing material 3 positioned on the above-described other end of the frame member 14 (refer to a symbol B in FIG. 7). Next, the local heating light 41 is irradiated to a region from one end to other end at a side of the above-described first sealing material, to which the local heating light 41 was irradiated, along the frame member (second frame member) 15 adjacent to the frame member 14, and the frame member 15 is sealed to the face plate 12 and the rear plate 13 (refer to a symbol C in FIG. 7). Thereafter, the local heating light 41 is irradiated to the first sealing material 3 positioned on the above-described other end of the frame member 15 (refer to a symbol D in FIG. 7). Similarly, the local heating light 41 is scanned in the order of E, F, G and H, and the local heating light 41 is irradiated for one round along the frame body 18.

Figure 6A:
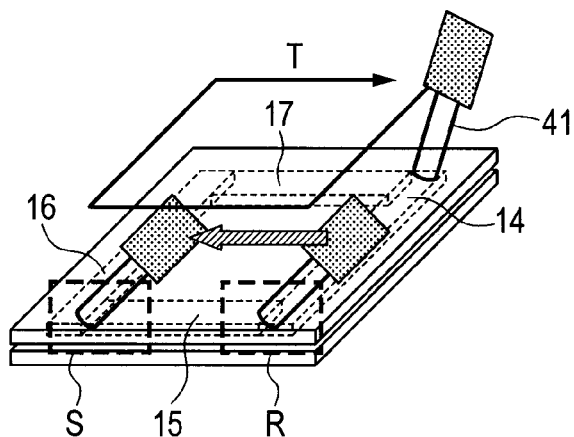
FIGS. 6A, 6B and 6C are views indicating a local heating light irradiating method in an example.
Figure 6B:
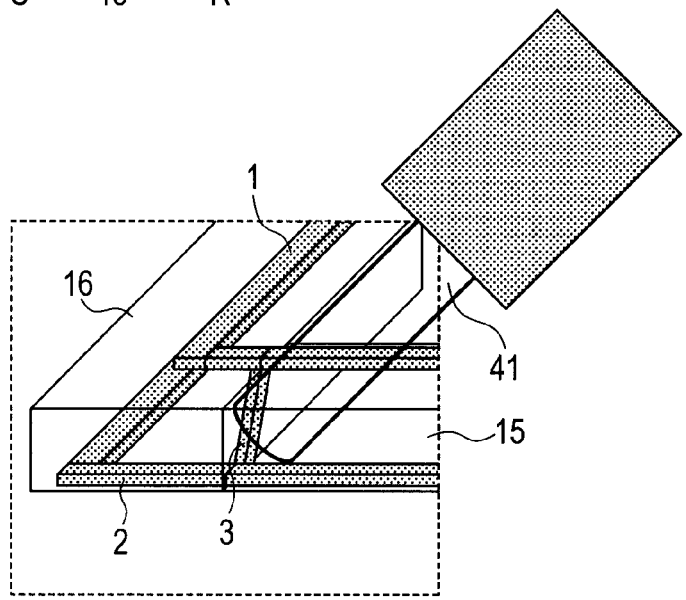
Figure 6C:
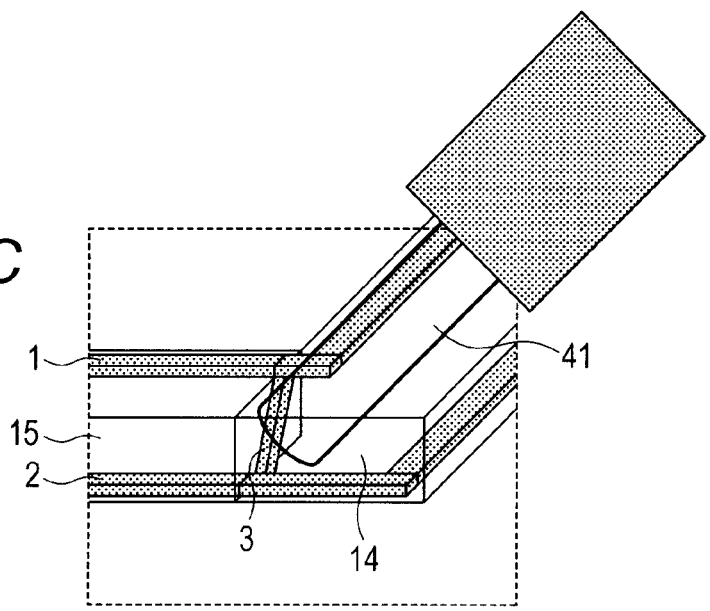

Like this manner, in case of melting the sealing material 3 in the course of irradiating the local heating light 41 by moving the local heating light 41, a method of performing the irradiation by moving the local heating light 41 while maintaining the local heating light 41 to be in a state of inclined to the normal line direction of a sealing surface is preferable as indicated in FIGS. 6A to 6C. FIGS. 6B and 6C are respectively enlarged diagrams of a region S and a region R indicated in FIG. 6A. As indicated in these diagrams, an irradiation angle of the local heating light 41 is not required to be changed when performing the irradiation to the sealing materials 1, 2 and 3 by inclining the local heating light 41 to the normal line direction of a sealing surface, and there is such an advantage capable of simplifying a manufacturing process.

Like the present embodiment, in case of sealing the frame members 14 to 17 to a substrate such as the face plate 12 or the rear plate 13 by using the local heating light 41, the temperature of the frame members 14 to 17 having the small volume is easily increased as compared with the substrate. Therefore, the expansion/contraction amount of the frame members 14 to 17 becomes larger than that of the substrate at the time before and after the sealing process. For this reason, the expansion/contraction amount of the frame members 14 to 17 is accumulated to a scanning direction T (FIG. 6A) of the local heating light 41 in the course of irradiating the local heating light 41, as indicated in FIG. 7. According to the scanning order of the above-described local heating light 41, an unsealed separation portion of the frame body 18 exists on a downstream side end portion in the scanning direction T, and the first sealing material 3 of an unsealed portion positioned at the separation portion is compressed, and the compressive strain is to be generated in the vicinity of the first sealing material 3. In the present embodiment, the first sealing material 3 at the unsealed portion on the downstream side end portion in the scanning direction T of the local heating light 41 is heated and melted and the accumulated compressive strain is decreased at the same time.

When it is considered that the compressive strain accumulated on the frame body 18 in this manner is decreased by a process of heating and melting the first sealing material 3, the scanning order of the local heating light 41 in a sealing process can be generalized as follows. That is, when the local heating light 41 is scanned toward a sealed portion in the second sealing material 1 along an unsealed portion in the second sealing material 1, a separation portion with an unsealed state is made to reach a portion between the downstream side end portion of the scanning and the sealed portion. After scanning the local heating light 41 to the downstream side end portion, the scanning order of the local heating light 41 is determined so that the local heating light 41 is irradiated to the unsealed separation portion between the above-described sealed portion and the downstream side end portion, that is, the unsealed first sealing material 3.

Incidentally, if it is intended to scan the local heating light 41 along the frame body 18 in order to heat and melt the sealing materials 1 and 2, the local heating light 41 is to be scanned at least one time toward the sealed portions of the sealing materials 1 and 2 even if the scanning order is any order. Therefore, the generalized scanning order as described above can be preferably utilized when the frame body 18 is sealed to the substrate by the local heating light 41.

In the above-described embodiment, although a method of sealing the face plate 12 to the frame body 18 and the rear plate 13 to the frame body 18 at the same time has been described, the present invention is not limited to this case. For example, after completing to seal the one substrate to the frame body 18 by irradiating the local heating light 41 with the above-described scanning order, the other substrate may be sealed to the frame body 18. In this case, the substrate which is earlier sealed to the frame body 18 may be the face plate 12 or the rear plate 13.

According to a manufacturing method of a hermetic container of the present invention, both of joining strength and airtightness of the hermetic container can be realized. Therefore, if this hermetic container is used as a container of an image displaying apparatus, the image displaying apparatus can be stably driven for a long time.

EXAMPLE 1

Hereinafter, the present invention will be described in detail by exemplifying specific examples.

Step 1 (Preparation Stage)

The frame members 14 to 17 made from glass was formed. Concretely, a high strain point glass substrate (PD200 manufactured by ASAHI Glass Co., Ltd.), of which thickness was 1.5 mm, was first prepared as indicated in FIG. 1A. Then, the frame members 14 and 16 were cut out to have such an external form, of which the size was 580 mm×5 mm×1.5 mm, and the frame members 15 and 17 were cut out to have such an external form, of which the size was 970 mm×5 mm×1.5 mm. Next, the grease on surfaces of the frame members to 17 was removed by methods of an organic solvent cleaning, a pure water rinse and a UV-ozone cleaning.

In this example, the glass frit was used as the sealing materials 1, 2 and 3. As the glass frit, a Bi-based glass frit of not containing the lead (BAS115 manufactured by ASAHI Glass Co., Ltd.) having a thermal expansion coefficient $\alpha=79\times10^{-7}/°$ C., a transition point of 357° C. and a softening point of 420° C. was treated as a base material, and a paste, in which organic substances were dispersively mixed, was used as a binder. After this paste was formed on the frame members 14 to 17 to have width of 1.0 mm and thickness of 10 μm by a dispenser as indicated in FIGS. 1C and 1D, it was dried at 120° C. Next, in order to burn out the organic substances, the paste was heated at 460° C. to be baked, and the frame members 14 to 17, on which the sealing materials 1, 2 and 3 were formed, were constituted.

Step 2 (Assembly Process)

Subsequently, the rear plate 13 was formed. Concretely, a glass substrate (PD200 manufactured by ASAHI Glass Co., Ltd.) having such an external form, of which the size was 1000 mm×600 mm×1.8 mm, was first prepared, and the grease on a surface of the glass substrate was removed by methods of the organic solvent cleaning, the pure water rinse and the UV-ozone cleaning. Next, a surface electron conduction electron-emitting devices 27 and matrix wirings 28 and 29 were formed on a region of 950 mm×540 mm in a central portion of the glass substrate obtained in this manner. The electron-emitting devices 27 were connected to the matrix wirings 28 and 29 so as to be able to be individually driven with the pixel number of 1920×3×1080. Next, a non-evaporable getter material composed of Ti was deposited on the matrix wirings 28 and 29 with the thickness of 2 μm by a sputtering method, and a non-evaporable getter was formed. As processed above, the rear plate 13 serving as a second substrate was prepared.

Next, the face plate 12 was formed as processed below. Concretely, a glass substrate (PD200 manufactured by ASAHI Glass Co., Ltd.) having such an external form, of which the size was 990 mm×590 mm×1.8 mm, was first prepared, and the grease on a surface of the glass substrate was removed by methods of the organic solvent cleaning, the pure water rinse and the UV-ozone cleaning. Next, a black matrix 35, which was in a matrix shape, was formed by a screen printing method by using a paste, which contained a glass paste, a black pigment and silver particles, on a region of 960 mm×550 mm in a central portion of the glass substrate obtained in this manner. A three-color phosphor array pattern 34 was formed by one by one color with three times by the screen printing method by using phosphor pastes of red, blue and green colors at an aperture of the black matrix. In addition, a metal back 36 was formed by performing a vacuum vapor deposition of Al for the black matrix and a phosphor array pattern forming region, and a non-evaporable getter 37 composed of Ti was formed on the metal back 36 by a sputtering method and then the face plate 12 was formed.

Next, as indicated in FIGS. 1A and 1B, the frame members 14 to 17, on which the sealing materials 1, 2 and 3 were formed, were arranged to form a frame shape having such an external form, of which the size was 980 mm×580 mm. A temporary assembly process was performed so that the sealing materials 1 and 2 contacted with respective of both the face plate 12 and the rear plate 13 while aligning the face plate 12 and the rear plate 13. In addition, in order to support the pressurizing force, which was to be applied to the temporary assembled structure obtained by temporarily assembling, the pressure was applied to the face plate 12 and the rear plate 13 to the direction of the frame members 14 to 17 by a pressurizing device (not illustrated).

Step 3 (Sealing Process)

The local heating light 41 (laser beam) was irradiated to the temporary assembled structure composed of the rear plate 13, the frame members 14 to 17, the sealing materials 1 to 3 and the face plate 12, made in the Step 2 while maintaining the pressurizing force. In the Example 1, a semiconductor laser device for the processing was prepared, and the laser head 61 was fixed to the breadboard 60. An optical axis of the local heating light 41 was set to such the direction inclined by 45° to the normal line direction of sealing surfaces of the frame members 14 to 17. The laser head 61 was arranged such that a distance between a laser emission port and the face plate 12 became 10 cm (FIG. 6A).

As the irradiation condition of the local heating light 41, a wavelength of 980 nm, a laser power of 600 W and an effective beam diameter of 3.5 mm were set, and an object including the sealing materials 1, 2 and 3 to be irradiated was moved at a speed of 600 mm/s to the scanning direction T. Incidentally, in this specification, the laser power was defined as a strength value obtained by integrating all the beams emitted from a laser head and the effective beam diameter was defined as a range, where the strength of a laser beam becomes equal to or larger than $e^{-2}$ of the peak strength.

In this example, the sealing process was performed by irradiating the local heating light 41 to the sealing materials 1 to 3 in the order of A, B, C, D, E, F, G and H as indicated in FIG. 7. In this case, as indicated in FIGS. 2B and 2C, a position of the local heating light 41 was adjusted such that the sealing materials 1, 2 and 3 were included in the effective beam diameter. Concretely, the local heating light 41 was first irradiated to the sealing materials 1 and 2 along the direction of A indicated in FIG. 7, and the frame member 14 was sealed to the face plate 12 and the rear plate 13. Thereafter, a sealed portion B between the frame member 14 and the frame member 15 was irradiated and the local heating light 41 was continuously scanned to the direction of C, whereby the frame member 15 was sealed to the face plate 12 and the rear plate 13. Then, a sealed portion D was irradiated to perform the sealing process. Thus, in this example, the local heating light 41 was irradiated to the respective frame members and the first sealing material 3 adjacent to these frame members in sequence, and a process of sealing the frame members 14 to 17 to the face plate 12 and the rear plate 13 was completed. According to this order, the deformation of an air container and the misalignment between the face plate 12 and the rear plate 13 due to that deformation could be more decreased.

After dividing a display region of an FED device manufactured in this example into nine areas, as a result of measuring a misalignment between both plates 12 and 13 occurred by the irradiation of the local heating light 41 at positions of representing the respective nine areas, a misalignment of 1.1 μm (3σ=±0.2 μm) was confirmed as a mean value of the nine areas. Here, a symbol σ denotes a standard deviation of the misalignment amount.

As processed above, the container of the FED device was manufactured. Next, the internal space of the above-described container was exhausted from the exhaust hole (not illustrated) which was previously formed at the rear plate 13, and the FED device was manufactured. When the manufactured FED device was driven, it was confirmed that two dimensional light-emitting pattern arrays were uniformly arrayed over the entire display area. Furthermore, it was confirmed that the electron emission performance and the image display performance were stably maintained for a long time and the sealed portions of the frame members 14 to 17 secured the strength and stable airtightness having such a level which could be applied to the FED device.

EXAMPLE 2

In this example, the sealing material 1 was first heated and melted by the irradiation of the local heating light 41, and after the face plate 12 was sealed to the frame members 14 to 17, the sealed portions of the respective frame members 14 to 17 were sealed by heating and melting the sealing material 3. The order of irradiating the local heating light 41 to the face plate 12 and the frame members 14 to 17 was set to such the order which was same as that of the Example 1. However, a process of sealing the rear plate to the frame members 14 to 17 was performed after completing a process of sealing the face plate 12 to the frame members 14 to 17 and a process of sealing the frame members 14 to 17 each other. Excepting this condition, the FED device was manufactured by a manner similar to the case of the Example 1. Similar to the case of the Example 1, as a result of measuring a misalignment occurred by the irradiation of the local heating light 41, it was confirmed that the misalignment was 2.1 μm (3σ=±0.4 μm) as a mean value of the nine areas.

Similar to the case of the Example 1, when the manufactured FED device was driven, it was confirmed that two dimensional light-emitting pattern arrays were uniformly arrayed over the entire display area. Furthermore, it was confirmed that the electron emission performance and the image display performance were stably maintained for a long time and the sealed portions of the frame members 14 to 17 secured the strength and stable airtightness having such a level which could be applied to the FED device.

EXAMPLE 3

In this example, the sealed portions B, D and F were first irradiated in spots by the local heating light 41 in FIG. 7. As the irradiation condition, a wavelength of 980 nm, a laser power of 390 W, an effective beam diameter of 3.5 mm and an irradiating time of 10 ms (millisecond) were set. According to this procedure, the frame body 18 was constituted in such a frame shape having only one separation portion. Instead of this manner, the frame body 18, which previously had only one separation portion, might be prepared. Like this, the frame body 18 might not be required to be constituted by plural frame members. Thereafter, the face plate 12 and the rear plate 13 were sealed by the moving irradiation of the local heating light 41 in the order of A, C, E and G in FIG. 7, and a sealed portion H was lastly irradiated in spots. The FED device was manufactured by a manner similar to the case of the Example 1 excepting the irradiation order of the local heating light 41. Similar to the case of the Example 1, as a result of measuring a misalignment occurred by the irradiation of the local heating light 41, it was understood that the misalignment of 1.8 μm was occurred as a mean value of the nine areas.

When the FED device was driven, it was confirmed that the electron emission performance and the image display performance were stably maintained for a long time and the sealed portions secured the strength and stable airtightness having such a level which could be applied to the FED apparatus.

COMPARATIVE EXAMPLE 1

Figure 8A:
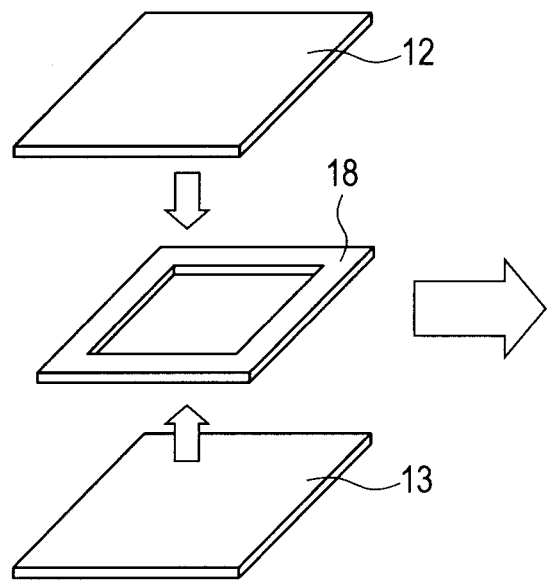
FIGS. 8A and 8B are perspective views indicating an assembly process in the comparative example.
Figure 8B:
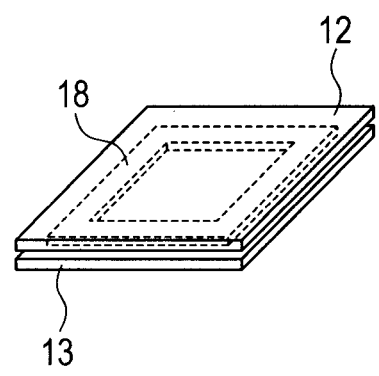

In the Comparative Example, one-body frame was used as the frame body 18 as illustrated in FIGS. 8A and 8B. That is, in this Comparative Example, the frame body 18 does not have a separation portion, and the first sealing material is not required to be arranged and there is not a process of sealing a portion of the frame body. Instead of this situation, the integrated frame body 18 formed by previously sealing the plural strip-shaped frame members 14 to 17 each other may be used as the Comparative Example. Excepting the above point, the hermetic container and the FED device were manufactured by the manner similar to that of the Example 1. Similar to the case of the Example 1, as a result of measuring a misalignment occurred by the irradiation of the local heating light 41, it was understood that the misalignment of 16 μm (3σ=±0.5 μm) was occurred as a mean value of the nine areas.

When the FED device was driven, it was confirmed that the electron emission performance and the image display performance were stably maintained for a long time and the sealed portions of the frame members 14 to 17 secured the strength and stable airtightness having such a level which could be applied to the FED device. However, it was recognized that the two dimensional light-emitting pattern arrays had a misalignment on a circumference portion of a display area, and it was confirmed that the luminance at a peripheral portion of a display area was relatively in a low level for the luminance of a central portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-198912, filed Sep. 6, 2010, which is hereby incorporated by reference herein in its entirety.

What is claimed is:

1. A manufacturing method of a hermetic container, which includes sealing a first substrate and a frame body comprising a part of the hermetic container, the method comprising:
    an assembling step which includes a first step of arranging the frame body so as to have at least one separation portion having mutually facing two surfaces being separated from each other and of arranging a first sealing material between the facing two surfaces, and a second step of assembling the first substrate and the frame body so that a second sealing material having a frame shape along the frame body is arranged between the first substrate and the frame body; and a sealing step which includes sealing the frame body to the first substrate by scanning local heating light along the second sealing material and heating and melting the second sealing material, and sealing the separation portion of the frame body by irradiating the local heating light to the first sealing material provided in the separation portion, wherein, in the sealing step, order of the scanning of the local heating light is determined so that, when the local heating light is scanned along an unsealed portion of the second sealing material toward an already-sealed portion of the second sealing material, the separation portion of an unsealed state is set between a downstream end of the scanning and the already-sealed portion, and after the local heating light is scanned up to the downstream end, the local heating light is irradiated to the separation portion of the unsealed state between the already-sealed portion and the downstream end, wherein in the assembling step, the frame body is arranged between the first substrate and a second substrate so that a third sealing material having a frame shape along the frame member is arranged between the second substrate different from the first substrate and the frame body, in the sealing step, the local heating light is irradiated simultaneously to the second sealing material and the third sealing material to seal the frame body also to the second substrate, and in the assembling step, the third sealing material is arranged so as to produce a portion, which is not overlapped with the second sealing material observed from an irradiation source of the local heating light in the sealing step.

2. The manufacturing method according to claim 1, wherein the frame body includes plural frame members, and in the first step, the plural frame members are arranged like a frame so as to face each other across the first sealing material in the separation portion.

3. The manufacturing method according to claim 2, wherein the sealing step irradiates the local heating light to a circumference of the frame body by repeating a step of scanning the local heating light from one end to the other end along a first frame member included in the plural frame members to irradiate the local heating light to the second sealing material and then irradiating the local heating light to the first sealing material positioned at the other end of the first frame member, and a step of irradiating the local heating light from one end to the other end on the side of the first sealing material to which the local heating light was irradiated along a second frame member adjacent to the first frame member and 'then irradiating the local heating light to the first sealing material positioned at the other end of the second frame member.

4. The manufacturing method according to claim 1, further comprising a step of, after the sealing step, sealing the second substrate and the frame body to each other by irradiating the local heating light to the third sealing material.

5. The manufacturing method according to claim 1, wherein, in the assembling step, the first sealing material is provided so as to bridge between the second sealing material and the third sealing material.

* * * * *